(12) United States Patent
Otsubo (10) Patent No.: US 12,339,406 B2
(45) Date of Patent: Jun. 24, 2025

(54) RADIATION IMAGING APPARATUS AND CABLE HOLDER

(71) Applicant: CANON KABUSHIKI KAISHA, Tokyo (JP)

(72) Inventor: Yoshitaka Otsubo, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 134 days.

(21) Appl. No.: 18/313,640

(22) Filed: May 8, 2023

(65) Prior Publication Data
US 2023/0367022 A1  Nov. 16, 2023

(30) Foreign Application Priority Data

May 13, 2022  (JP) ................. 2022-079520

(51) Int. Cl.
*G01T 1/17* (2006.01)
*G01T 7/00* (2006.01)
*H05K 5/02* (2006.01)
(52) U.S. Cl.
CPC .................. *G01T 1/17* (2013.01); *G01T 7/00* (2013.01); *H05K 5/0247* (2013.01)
(58) Field of Classification Search
CPC ........... G01T 1/17; G01T 7/00; H05K 5/0247; A61B 6/44; A61B 6/102; A61B 6/107; A61B 6/42
See application file for complete search history.

(56) References Cited

U.S. PATENT DOCUMENTS

| 4,549,780 | A | * | 10/1985 | Bertini | ................. H01R 13/595 |
| | | | | | 439/468 |
| 2002/0017610 | A1 | * | 2/2002 | Takemoto | ................. G01T 1/24 |
| | | | | | 250/370.09 |

FOREIGN PATENT DOCUMENTS

| JP | 2007155375 A | 6/2007 |
| JP | 2012208334 A | 10/2012 |
| JP | 2019184238 A | 10/2019 |
| JP | 2021061232 A | 4/2021 |
| JP | 6656489 B1 | 5/2021 |

* cited by examiner

*Primary Examiner* — Kiho Kim
(74) *Attorney, Agent, or Firm* — Canon U.S.A., Inc. I.P. Division (57) ABSTRACT

A radiation imaging apparatus includes a radiation detector that detects incident radiation and converts the radiation into an electric signal regarding a radiation image, a housing containing the radiation detector, a cable that electrically connects the radiation detector and an external apparatus, and a cable holder fixed to the housing and configured to hold the cable and that has a plurality of openings for routing the cable in different directions.

13 Claims, 7 Drawing Sheets

RADIATION IMAGING APPARATUS AND CABLE HOLDER

BACKGROUND

Field

The present disclosure relates to a radiation imaging apparatus that detects incident radiation and converts the radiation into an electric signal regarding a radiation image and a cable holder.

Description of the Related Art

In the medical field, a radiation imaging apparatus (digital radiography) that uses a sensor formed of a semiconductor to capture a radiation image has become widely used. A cable for receiving power supply and communicating signals with an imaging control apparatus, which is an external apparatus, is connected to the radiation imaging apparatus. The radiation imaging apparatus mounted to an imaging table is assumed to be used.

In the radiation imaging apparatus to which the above-mentioned cable is connected, the cable can obstruct constituent elements of a fixing portion that fixes the radiation imaging apparatus and load can be applied due to the cable being bent, depending on a cable routing method. At this time, the bending of the cable and the load resulting therefrom leads to a risk for disconnection of the cable. Thus, it is desirable that the cable routing method be differentiated depending on a fixed state of the radiation imaging apparatus.

Japanese Patent Application Laid-Open No. 2012-208334 discusses a radiation imaging apparatus including a connector with terminal alignment designed to enable the connector to be connected in a plurality of connection directions. The radiation imaging apparatus described in Japanese Patent Application Laid-Open No. 2012-208334 enables for change of a cable routing direction by change of a connection direction of the connector, but results in restrictions on design of an alignment sequence of terminals.

SUMMARY

Aspects of the present disclosure are directed to a radiation imaging apparatus that enables for change of a cable routing direction with a simple configuration with little design restrictions.

According to an aspect of the present disclosure, a radiation imaging apparatus includes a radiation detector configured to detect incident radiation and convert the detected incident radiation into an electric signal regarding a radiation image, a housing containing the radiation detector, a cable configured to electrically connect the radiation detector and an external apparatus, and a cable holder fixed to the housing and configured to hold the cable, wherein the cable holder includes a plurality of openings for routing the cable in different directions.

Further features will become apparent from the following description of exemplary embodiments with reference to the attached drawings.

DESCRIPTION OF THE EMBODIMENTS

Exemplary embodiments for implementing the present disclosure will be described below with reference to accompanying drawings.

A first exemplary embodiment of the present invention will be initially described.

Figure 1A:
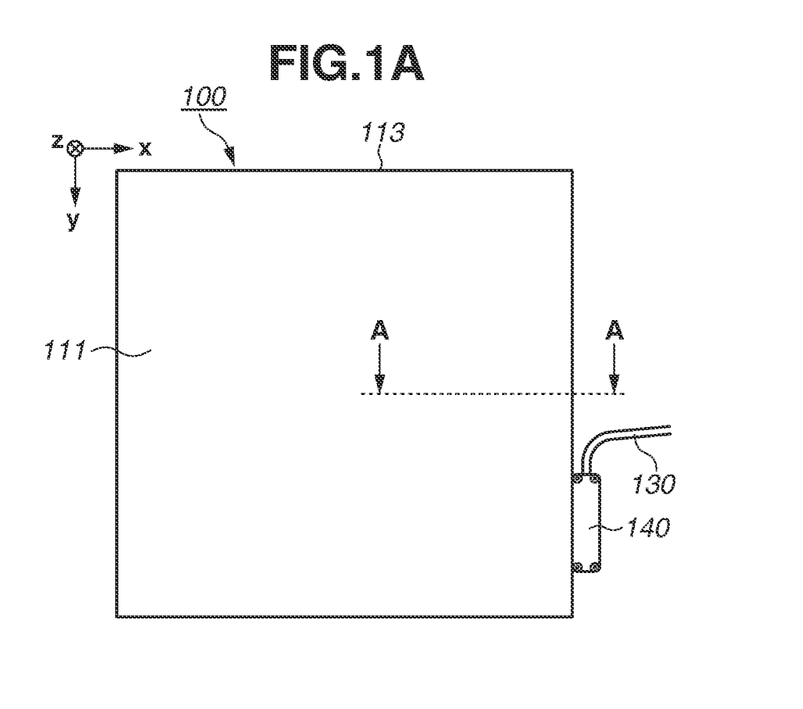
FIGS. 1A and 1B are diagrams each illustrating an example of an outer appearance of a radiation imaging apparatus according to a first exemplary embodiment.
Figure 1B:
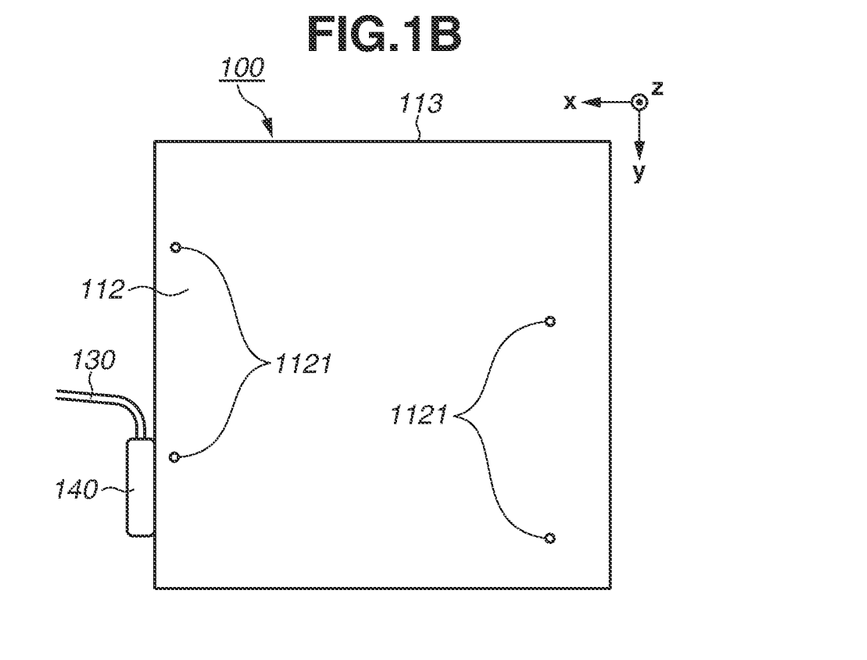

FIGS. 1A and 1B are diagrams each illustrating an example of an outer appearance of a radiation imaging apparatus 100 according to the first exemplary embodiment. Specifically, FIG. 1A is a diagram illustrating an example of the outer appearance of the radiation imaging apparatus 100 when viewed from a surface housing portion 111 side. The surface housing portion 111 is a constituent component of a housing of the radiation imaging apparatus 100 and includes a radiation incident surface on which radiation having passed through a subject is incident. FIG. 1A is a diagram illustrating an x-y-z coordinate system in which an incident direction of radiation is a z-axis direction, and two directions that are orthogonal to the z-axis direction and that are orthogonal to each other are x-axis and y-axis directions. FIG. 1B is a diagram illustrating an example of an outer appearance of the radiation imaging apparatus 100 when viewed from a back surface housing portion 112 side. The back surface housing portion 112 is a constituent component of the housing of the radiation imaging apparatus 100, and includes a back surface on the opposite side of the radiation incident surface described above. FIG. 1B illustrates an x-y-z coordinate system corresponding to the x-y-z coordinate system illustrated in FIG. 1A. FIGS. 1A and 1B each illustrate a frame housing portion 113. The frame housing portion 113 is a constituent component of the housing of the radiation imaging apparatus 100, and is disposed on a side surface when the housing of the radiation imaging apparatus 100 is viewed from the z-axis direction.

The radiation imaging apparatus 100 includes the housing, a cable 130, and a cable holder 140, as illustrated in FIGS. 1A and 1B. The housing includes the surface housing portion 111, the back surface housing portion 112, and the frame housing portion 113. As illustrated in FIG. 1B, the back surface housing portion 112 has threaded holes 1121 for mounting the housing of the radiation imaging apparatus 100 to the imaging table at a plurality of locations (four locations in the example illustrated in FIG. 1B). These threaded holes 1121 are arranged as close to on an outer periphery of the housing as possible (close to the frame housing portion 113), which ensures stability in fixation of the housing of the radiation imaging apparatus 100 with the imaging table.

Figure 2:
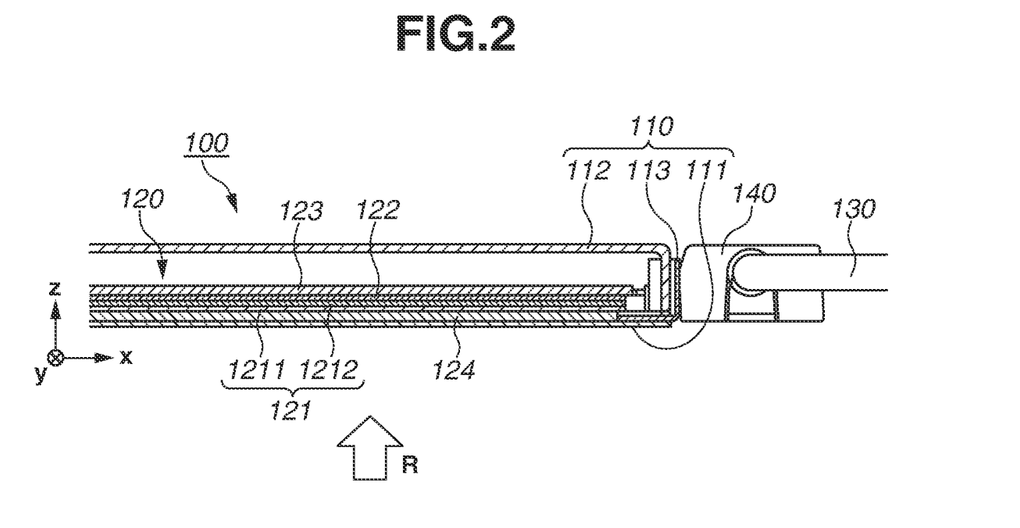
FIG. 2 is a diagram illustrating an example of an internal configuration in a section along line A-A in FIG. 1A in the radiation imaging apparatus according to the first exemplary embodiment.

FIG. 2 is a diagram illustrating an example of an internal configuration in a section along the line A-A in FIG. 1A in the radiation imaging apparatus 100 according to the first exemplary embodiment. In FIG. 2, constituent elements that are similar to those illustrated in FIGS. 1A and 1B are denoted by the same reference signs, and detailed descriptions thereof are omitted. FIG. 2 illustrates an x-y-z coordinate system corresponding to the x-y-z coordinate system illustrated in FIG. 1A.

A housing 110 of the radiation imaging apparatus 100 includes the surface housing portion 111, the back surface housing portion 112, and the frame housing portion 113 as illustrated in FIG. 2. The housing 110 of the radiation imaging apparatus 100 houses, as an internal configuration 120, a radiation detector 121, a radiation shielding member 122, a support base 123, and an impact absorption member 124.

The radiation detector 121 is a constituent part that detects incident radiation R having passed through a subject and converts an electric signal regarding a radiation image. The radiation detector 121 includes a phosphor layer (scintillator layer) 1211 and a sensor 1212, as illustrated in FIG. 2. The phosphor layer (scintillator layer) 1211 is a constituent part in which phosphors that convert the incident radiation R having passed through the subject into light (e.g., visible light) are laminated. As a constituent material of the phosphor layer (scintillator layer) 1211, gadolinium oxysulfide (GOS) ($Gd_2O_2S$) or cesium iodide (CsI) is generally used in many cases. The sensor 1212 is a constituent part that converts light generated in the phosphor layer (scintillator layer) 1211 into an electric signal regarding the radiation image. The sensor 1212 is formed using a glass substrate, typically. The electric signal regarding the radiation image, which is generated by the radiation detector 121, is transmitted to a display system (not illustrated) through an external communication unit (not illustrated), and is displayed as the radiation image. The display system is an example of an external apparatus.

The radiation shielding member 122 is a constituent part arranged between the radiation detector 121 (more specifically, the sensor 1212) and the support base 123.

The support base 123 is a constituent part that supports the radiation detector 121 via the radiation shielding member 122.

The impact absorption member 124 is a constituent part that is arranged between the radiation detector 121 and the surface housing portion 111. Since the sensor 1212 is generally formed using the glass substrate as described above, cracks can occur when the sensor 1212 is subjected to high impact, load, and displacement. Thus, the impact absorption member 124 for absorbing impact is arranged on a radiation incident surface of the sensor 1212 in the radiation imaging apparatus 100 according to the present exemplary embodiment.

In FIG. 2, the cable 130 is a constituent part that electrically connects the radiation detector 121 (e.g., the sensor 1212) and an external apparatus, such as an external power supply. The cable holder 140 is a constituent part that is fixed to the housing 110 of the radiation imaging apparatus 100 and holds the cable 130.

Figure 3A:
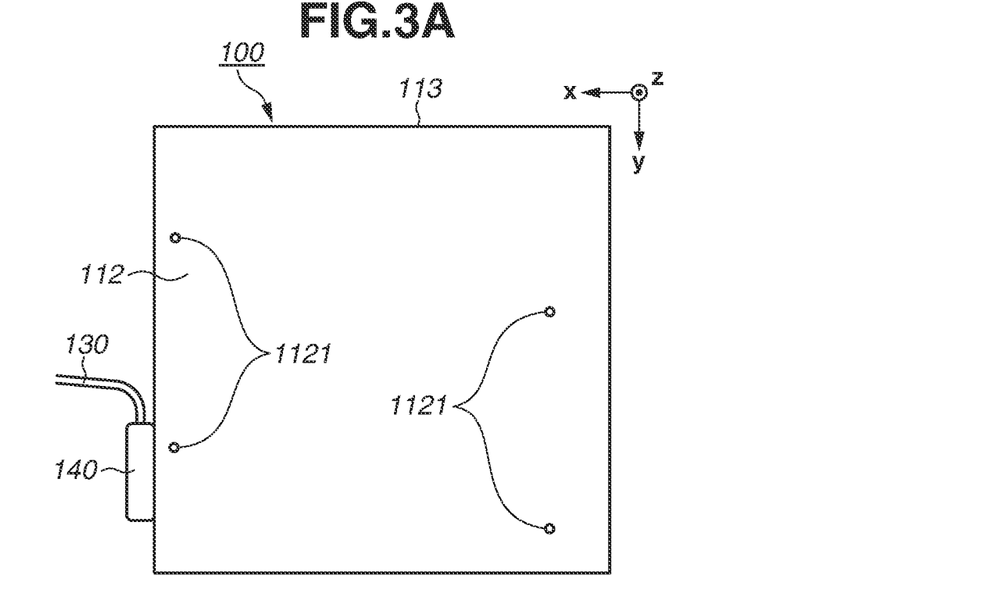
FIGS. 3A and 3B are diagrams each illustrating an example of an outer appearance of the radiation imaging apparatus according to the first exemplary embodiment, and an example in which a cable routing direction is changed.
Figure 3B:
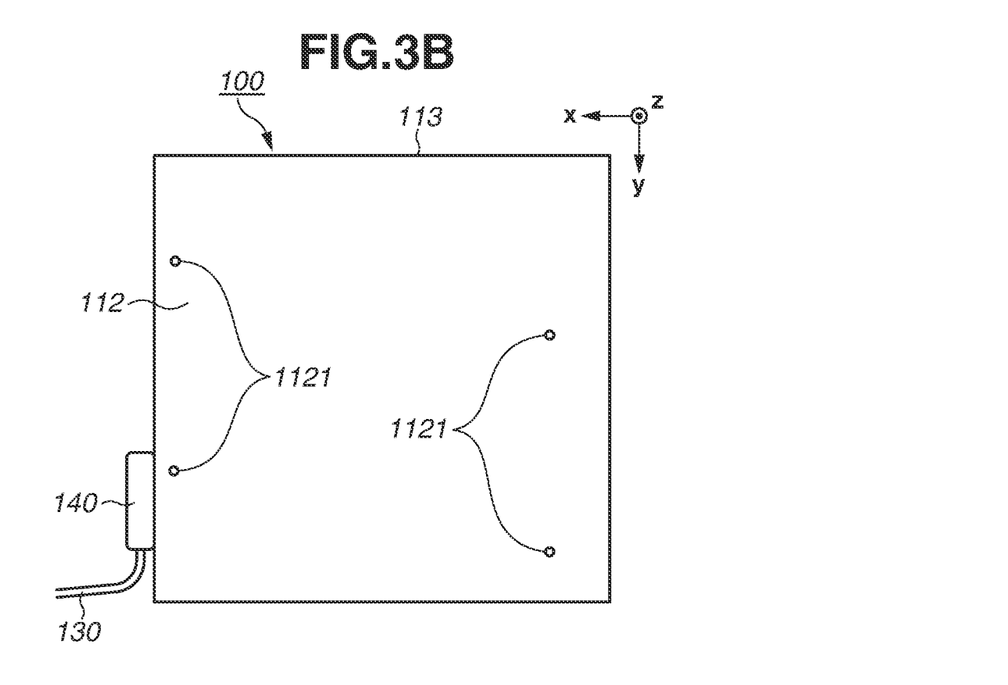

FIGS. 3A and 3B are diagrams each illustrating an example of an outer appearance of the radiation imaging apparatus 100 according to the first exemplary embodiment, and illustrating an example of changing a routing direction for the cable 130. In FIGS. 3A and 3B, constituent elements that are similar to those illustrated in FIGS. 1A, 1B, and FIG. 2 are denoted by the same reference signs, and detailed descriptions thereof are omitted. FIGS. 3A and 3B illustrate an x-y-z coordinate system corresponding to the x-y-z coordinate system illustrated in FIG. 1B.

In FIGS. 3A and 3B, the routing direction for the cable 130 is differentiated by 180 degrees with the cable holder 140. This enables switching of the routing direction for the cable 130 to a direction suitable for a single fixing method when the housing 110 of the radiation imaging apparatus 100 is fixed to the external imaging table via the threaded holes 1121, which are equivalent to the fixing method. This prevents the cable 130 from becoming an obstruction, and prevents a load due to excessive bending of the cable 130.

Figure 4:
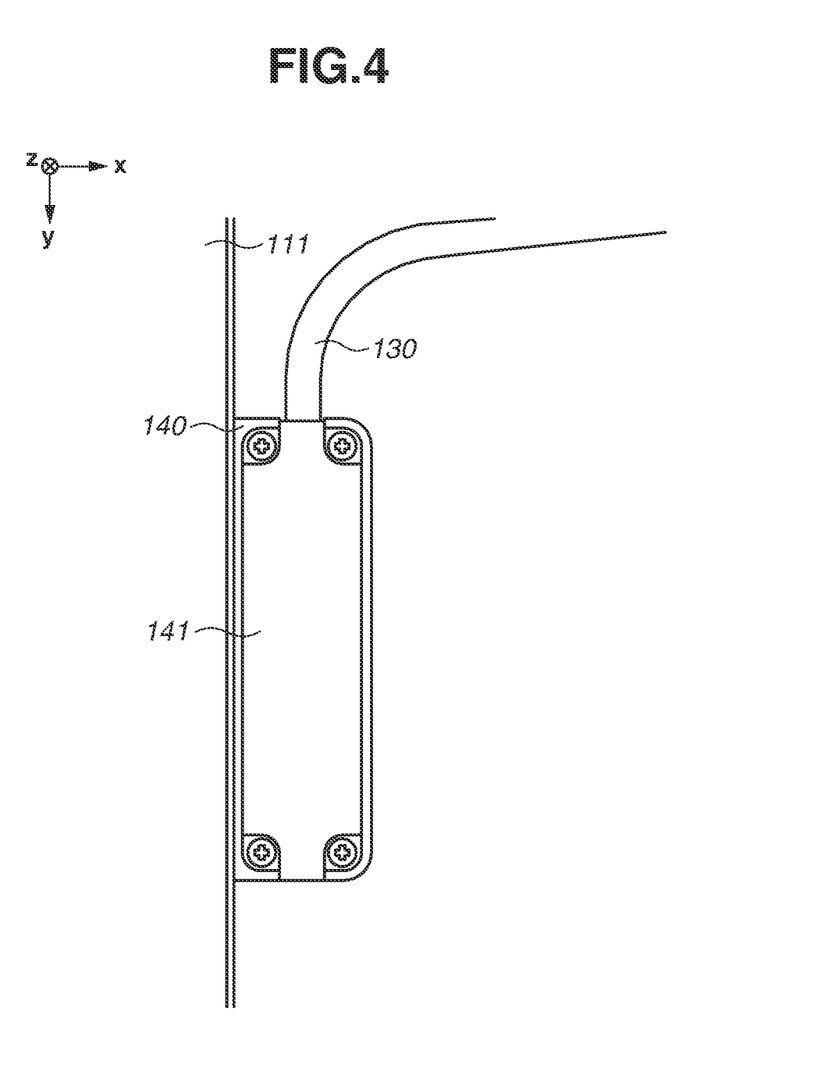
FIG. 4 is a diagram illustrating a detailed outer appearance of a cable holder illustrated in FIG. 1A.

FIG. 4 is a diagram illustrating an example of a detailed outer appearance of the cable holder 140 illustrated in FIG. 1A.

In FIG. 4, constituent elements that are similar to those illustrated in FIGS. 1A, 1B, and FIG. 2 are denoted by the same reference signs, and detailed descriptions thereof are omitted. FIG. 4 illustrates an x-y-z coordinate system corresponding to the x-y-z coordinate system illustrated in FIG. 1A.

The cable holder 140 includes a cable holder cover 141 that covers the inside of the cable holder 140. Removing the cable holder cover 141 enables access to the inside of the cable holder 140. The cable holder cover 141 is arranged on the surface housing portion 111 including the radiation incident surface, on which the radiation R is incident, in the housing 110 of the radiation imaging apparatus 100. With this configuration, in a case where the housing 110 is fixed to the imaging table via the threaded holes 1121 arranged in the back surface housing portion 112, it is possible to remove the cable holder cover 141 without disassembling the radiation imaging apparatus 100 from the imaging table and the radiation imaging apparatus 100 or disassembling the main body of the radiation imaging apparatus 100. In the present exemplary embodiment, in a case where the housing 110 is fixed to the imaging table, the routing direction for the cable 130 is switchable with work performed inside the cable holder 140 in a state where the cable holder cover 141 is removed and an opening is large.

Figure 5A:
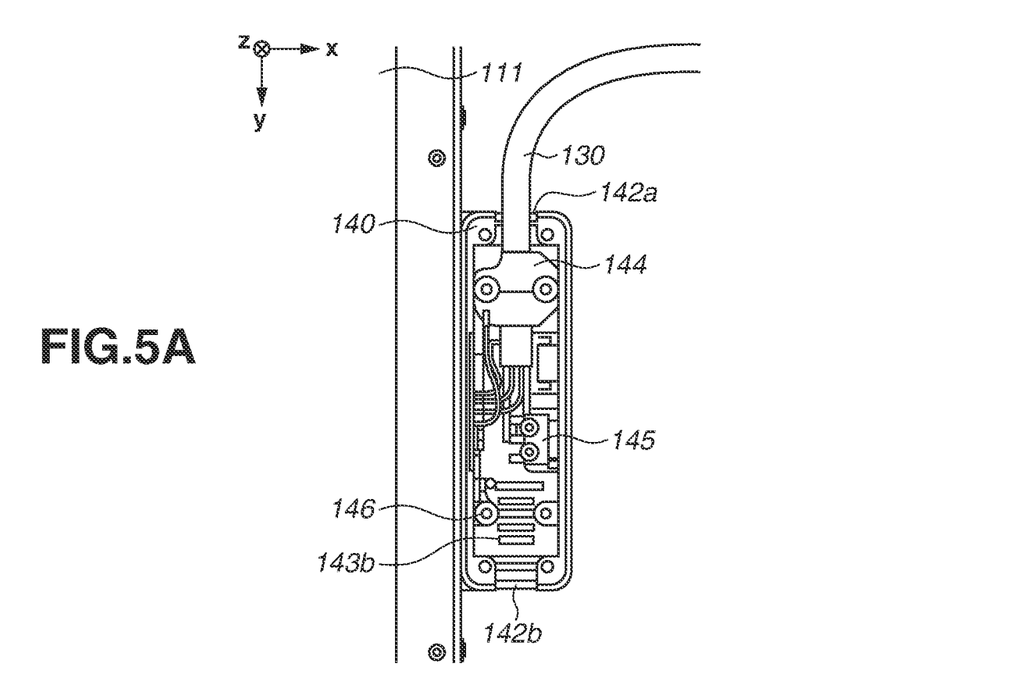
FIGS. 5A and 5B are diagrams each illustrating the first exemplary embodiment and an example of an internal configuration of the cable holder illustrated in FIG. 4 with a cable holder cover removed.
Figure 5B:
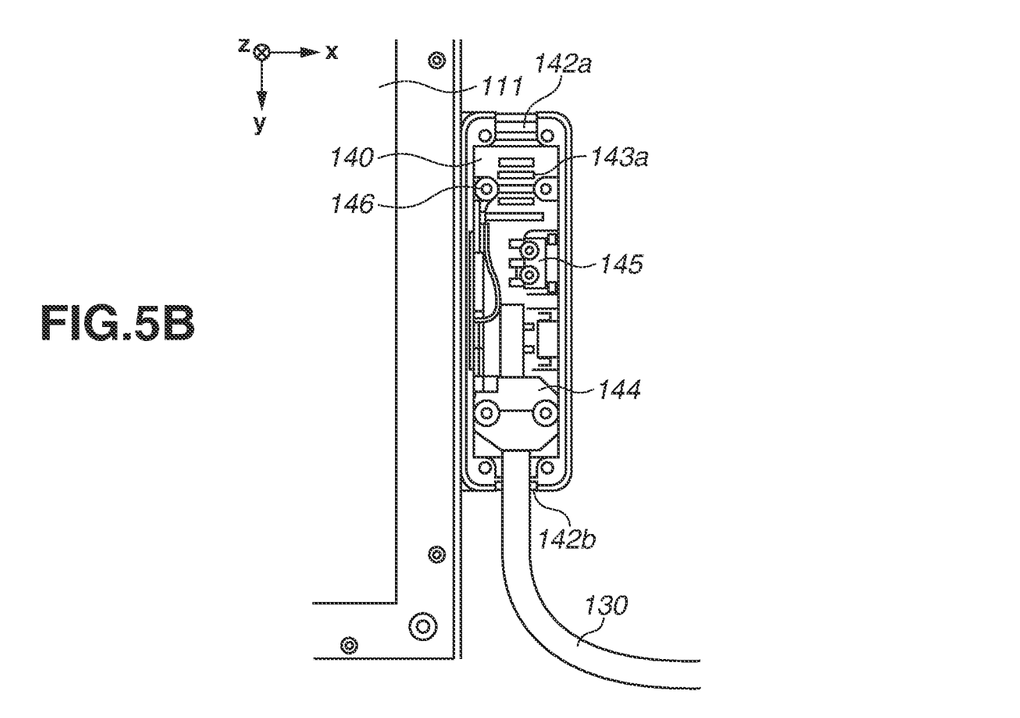

FIGS. 5A and 5B are diagrams each illustrating the first exemplary embodiment and an example of an internal configuration of the cable holder 140 with the cable holder cover 141 removed. In FIGS. 5A and 5B, constituent elements that are similar to those illustrated in FIG. 4 are denoted by the same reference signs, and detailed descriptions thereof are omitted. FIGS. 5A and 5B each illustrate an x-y-z coordinate system corresponding to the x-y-z coordinate system illustrated in FIG. 4.

The cable holder 140 has a plurality of openings, an opening 142a and an opening 142b, for switching the routing direction for the cable 130 between different directions as illustrated in FIGS. 5A and 5B. In the present exemplary embodiment, whether the opening 142a or the opening 142b the cable 130 is withdrawn is selected depending on the routing direction for the cable 130. More specifically, in a case where the cable 130 is routed in a direction from above the cable holder 140 (−y-axis direction), the cable 130 is withdrawn from the opening 142a as illustrated in FIG. 5A. In a case where the cable 130 is routed in a direction from below the cable holder 140 (+y-axis direction), the cable 130 is withdrawn from the opening 142b as illustrated in FIG. 5B.

The cable holder 140 includes a plurality of protruded portions, a protruded portion 143a and a protruded portion 143b, a cable retaining plate 144, a boot switch 145, and a ground (GND) element 146, as illustrated in FIGS. 5A and 5B. A plurality of fixing elements for fixing each of the cable retaining plate 144, the boot switch 145, and the GND element 146 is arranged inside the cable holder 140, as illustrated in FIGS. 5A and 5B.

The protruded portions 143a and 143b are constituent parts that prevent withdrawal of the cable 130 that is routed from one of the plurality of openings, the openings 142a and 142b. More specifically, the protruded portion 143a, together with the cable retaining plate 144, sandwiches and presses the cable 130 routed from the opening 142a, and has a function of preventing withdrawal of the cable 130 when force is applied in a withdrawing direction for the cable 130. The protruded portion 143b, together with the cable retaining plate 144, sandwiches and presses the cable 130 routed from the opening 142b, and has a function of preventing withdrawal of the cable 130 when force is applied in the withdrawing direction for the cable 130.

The cable retaining plate 144 is a constituent part that prevents withdrawal of the cable 130 routed from one of the plurality of openings, the openings 142a and 142b. More specifically, in a case where the cable 130 is withdrawn from the opening 142a, the cable retaining plate 144 is fixed to the cable holder 140 at a first position with, for example but not limited to, screw, sandwiches and presses, together with the protruded portion 143a, the cable 130, and prevents withdrawal of the cable 130. In a case where the cable 130 is withdrawn from the opening 142b, the cable retaining plate 144 is fixed to the cable holder 140 at a second position with, for example but not limited to a screw, sandwiches and presses, together with the protruded portion 143b, the cable 130, and prevents withdrawal of the cable 130. In other words, in a case where the routing direction for the cable 130 is switched with the cable holder 140, a mounting position of the cable retaining plate 144 in the cable holder 140 is changed.

The boot switch 145 is used for switching an imaging mode of the radiation imaging apparatus 100. More specifically, in a case where the cable 130 is withdrawn from the opening 142a, the boot switch 145 is fixed to the cable holder 140 at a third position with, for example but not limited to a screw, as illustrated in FIG. 5A. In a case where the cable 130 is withdrawn from the opening 142b the boot switch 145 is fixed to the cable holder 140 at a fourth position with, for example but not limited to a screw, as illustrated in FIG. 5B. In other words, in a case where the routing direction for the cable 130 is switched with the cable holder 140, a mounting position of the boot switch 145 in the cable holder 140 is changed.

The GND element 146 is an element for ensuring conduction with the inside of the radiation imaging apparatus 100. More specifically, in a case where the cable 130 is withdrawn from the opening 142a, the GND element 146 is fixed to the cable holder 140 at a fifth position with, for example but not limited to a screw, as illustrated in FIG. 5A. In a case where the cable 130 is withdrawn from the opening 142b, the GND element 146 is fixed to the cable holder 140 at a sixth position with, for example but not limited to a screw, as illustrated in FIG. 5B. In other words, in a case where the cable routing direction of the cable 130 is switched with the cable holder 140, a mounting position of the GND element 146 in the cable holder 140 is changed.

FIG. 5B illustrates an internal configuration of the cable holder 140 in a case where the routing direction for the cable 130 is changed from that in FIG. 5A. The respective mounting positions of the cable retaining plate 144, the boot switch 145, and the GND element 146 in the cable holder 140 illustrated in FIG. 5B are changed from those in the case illustrated in FIG. 5A. Thus, the cable retaining plate 144 and the protruded portions 143a and 143b produce the effect of preventing withdrawal of the cable 130 protruded portion regardless of the routing direction for the cable 130. The boot switch 145 and the GND element 146 become movable as appropriate to respective positions at which the boot switch 145 and the GND element 146 do not obstruct the routing of the cable 130.

Figure 6A:
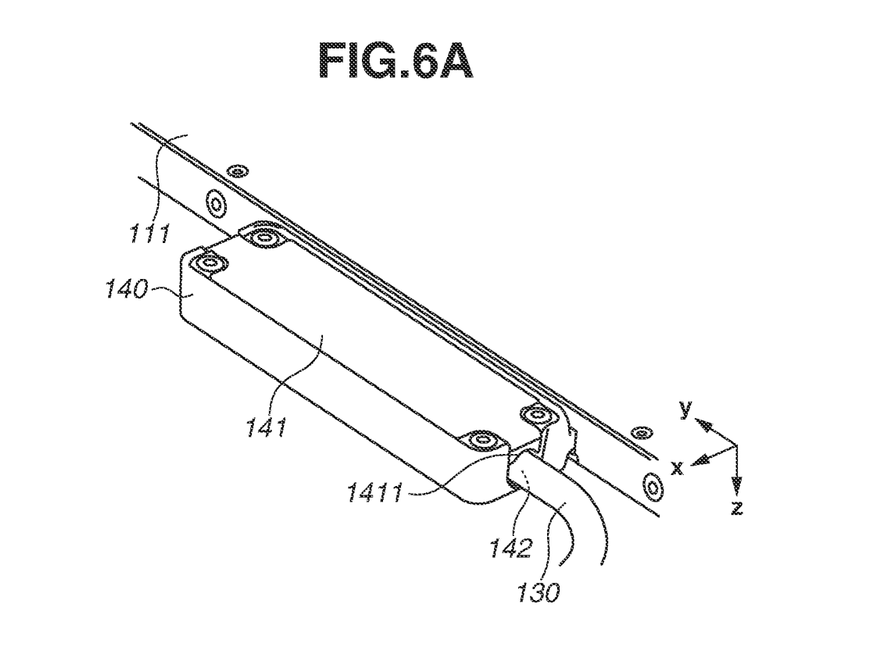
FIGS. 6A and 6B are diagrams each illustrating a detailed configuration example of the cable holder cover illustrated in FIG. 4.
Figure 6B:
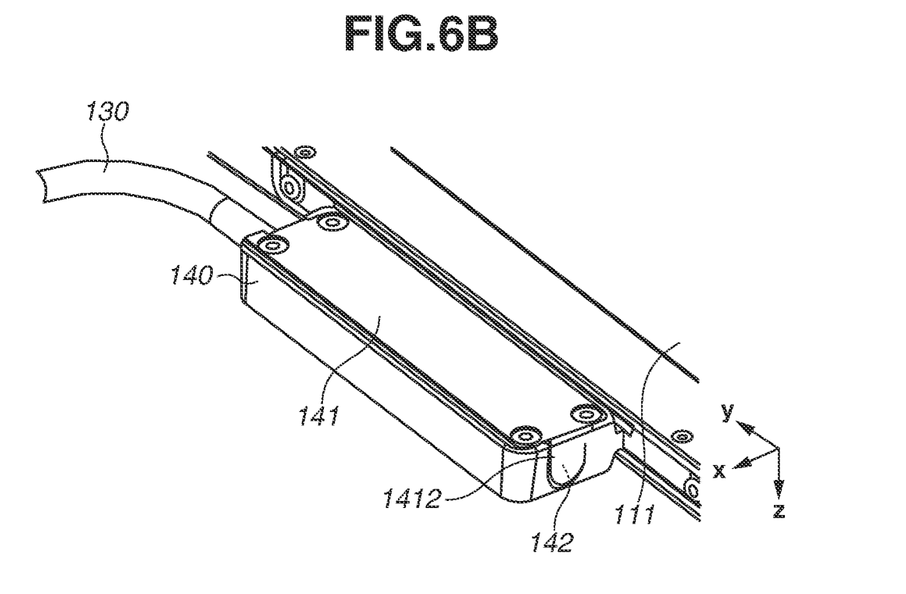

FIGS. 6A and 6B are diagrams each illustrating a detailed configuration example of the cable holder cover 141 illustrated in FIG. 4.

In FIGS. 6A and 6B, constituent elements that are similar to those illustrated in FIG. 4 are denoted by the same reference signs, and detailed descriptions thereof are omitted. FIGS. 6A and 6B each illustrate an x-y-z coordinate system corresponding to the x-y-z coordinate system illustrated in FIG. 4.

FIGS. 6A and 6B are diagrams each illustrating a configuration of the cable holder cover 141 in a case where the routing direction for the cable 130 is changed. The cable holder cover 141 includes a cover opening 1411 and a cover protrusion 1412, as illustrated in FIGS. 6A and 6B, respectively.

The cover opening 1411 is arranged in a location of one opening 142 from which the cable 130 is withdrawn from among the plurality of openings in the cable holder 140, as illustrated in FIG. 6A. Since the cover opening 1411 is arranged at a position of the cable holder cover 141 that presses, together with one opening 142 from which the cable 130 is withdrawn, the cable 130 in the present exemplary embodiment, it is possible to obtain the effect of preventing withdrawal of the cable 130.

The cover protrusion 1412 is arranged in a location of the opening 142, which is another opening except for the one opening from which the cable 130 is withdrawn, from among the plurality of openings in the cable holder 140, as illustrated in FIG. 6B. In the present exemplary embodiment, the cover protrusion 1412 is arranged to cover the other opening 142 except for the opening from which the cable 130 is withdrawn.

In this manner, covering the other opening 142, except for the opening from which the cable is withdrawn, with the cover protrusion 1412 can maintain light shielding performance of the radiation imaging apparatus 100 (more specifically, the cable holder 140). The configuration can also maintain waterproof performance and dust-proof performance depending on a configuration of the radiation imaging apparatus 100 (more specifically, the cable holder 140).

The cable holder cover 141 can be mounted to the cable holder 140 fixed to the housing 110 of the radiation imaging apparatus in different positions depending on the routing direction for the cable 130. In other words, the cable holder cover 141 is configured so that the positions of the cover opening 1411 and the cover protrusion 1412 are switchable depending on the routing direction for the cable 130. With this configuration, in a case where the routing direction for the cable 130 is changed by the cable holder 140, it is possible to ensure functions of the cover opening 1411 and cover protrusion 1412 with a single component by switching of the cable holder cover 141.

As described above, in the radiation imaging apparatus 100 according to the first exemplary embodiment, the cable holder 140 that is fixed to the housing 110 and that holds the cable 130 includes the plurality of openings 142 for routing the cable 130 in different directions.

The above-mentioned configuration enables providing the radiation imaging apparatus 100 allowing for change of the routing direction for the cable 130 with a simple configuration and a simple operation. This can prevent the cable 130 from becoming an obstacle and prevents load due to excessive bending of the cable 130, for example, when the housing 110 of the radiation imaging apparatus 100 is fixed to the imaging table.

A second exemplary embodiment will now be described.

An outer appearance of a radiation imaging apparatus according to the second exemplary embodiment is similar to the outer appearance of the radiation imaging apparatus 100 according to the first exemplary embodiment illustrated in FIGS. 1A, 1B, 3A, and 3B. An internal configuration of the radiation imaging apparatus 100 according to the second exemplary embodiment is similar to the internal configuration of the radiation imaging apparatus 100 according to the first exemplary embodiment illustrated in FIG. 2. A detailed outer appearance of the cable holder 140 according to the second exemplary embodiment is similar to the detailed outer appearance of the cable holder 140 according to the first exemplary embodiment illustrated in FIG. 4.

A detailed configuration of the cable holder cover 141 according to the second exemplary embodiment is similar to the detailed configuration of the cable holder cover 141 according to the first exemplary embodiment illustrated in FIGS. 6A and 6B.

In the second exemplary embodiment, a description will be provided of a case where a fixing position of part of the constituent elements (specifically, the boot switch 145) in the internal configuration of the cable holder 140 is not changed even with the routing direction for the cable 130 changed.

Figure 7A:
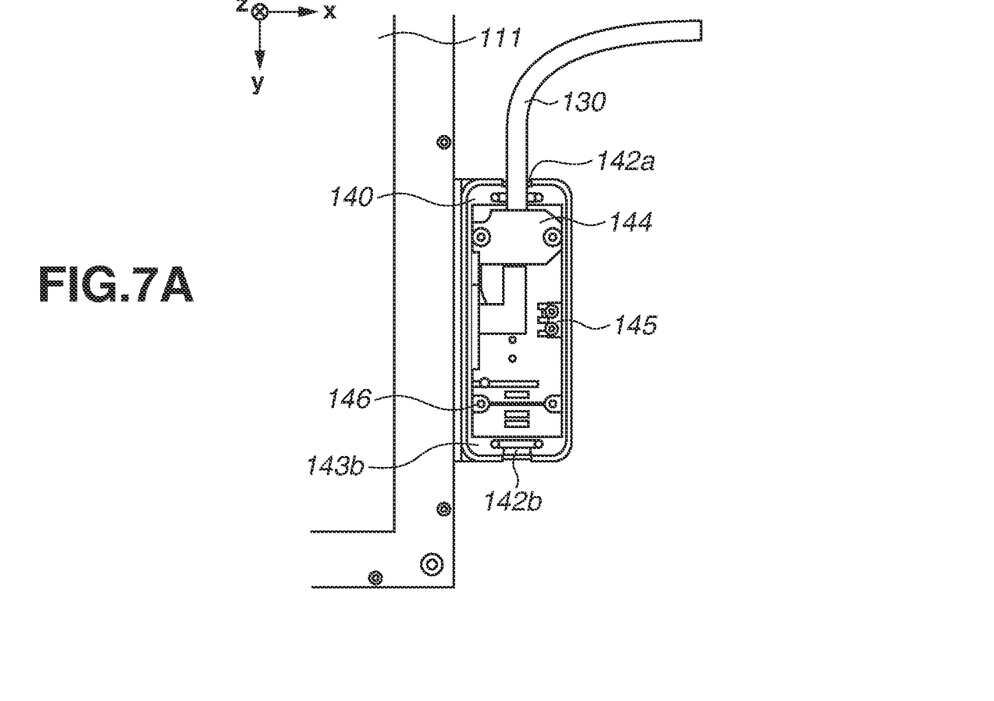
FIGS. 7A and 7B are diagrams each illustrating a second exemplary embodiment and an example of an internal configuration of the cable holder illustrated in FIG. 4 with the cable holder cover removed.
Figure 7B:
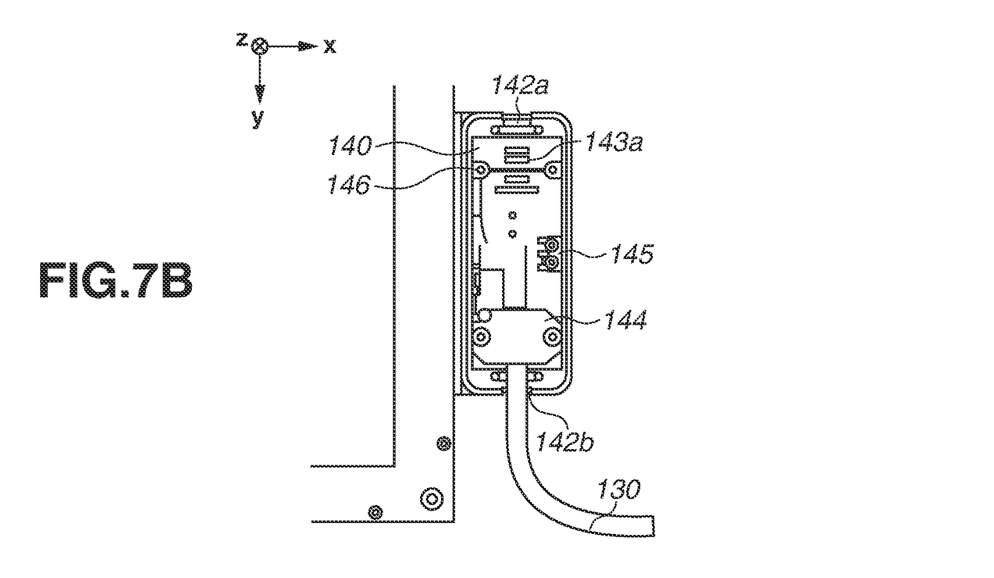

FIGS. 7A and 7B are diagrams each illustrating the second exemplary embodiment and an example of the internal configuration of the cable holder 140 illustrated in FIG. 4 with the cable holder cover 141 removed. In FIGS. 7A and 7B, constituent elements that are similar to those illustrated in FIGS. 5A and 5B are denoted by the same reference signs, and detailed descriptions thereof are omitted. FIGS. 7A and 7B each illustrate an x-y-z coordinate system corresponding to the x-y-z coordinate system illustrated in FIGS. 5A and 5B.

The cable holder 140 includes the plurality of openings, the opening 142*a* and the opening 142*b*, the plurality of protruded portions, the protruded portion 143*a* and the protruded portion 143*b*, the cable retaining plate 144, the boot switch 145, and the GND element 146, as illustrated in FIGS. 7A and 7B.

In FIG. 7A, the cable 130 is withdrawn from the opening 142*a* to the outside.

FIG. 7B illustrates an internal configuration of the cable holder 140 in a case where the cable routing direction of the cable 130 is changed from that in FIG. 7A. More specifically, in FIG. 7B, the cable 130 is withdrawn from the opening 142*b* to the outside. Respective mounting positions of the cable retaining plate 144 and GND element 146 in the cable holder 140, which are illustrated in FIG. 7B, are changed from those illustrated in FIG. 7A. This configuration of the cable retaining plate 144 and the protruded portion 143 produces the effect of preventing the withdrawal of the cable 130 protruded portion regardless of the routing direction for the cable 130. In the example illustrated in FIGS. 7A and 7B, the boot switch 145 is fixed at a predetermined position at which the boot switch 145 does not interfere with the cable 130 regardless of the routing direction for the cable 130, without change of the mounting position of the boot switch 145 in the cable holder 140. In the second exemplary embodiment, in addition to the boot switch 145, the GND element 146 can also be fixed at a predetermined position at which the GND element 146 does not interfere with the cable 130 regardless of the routing direction for the cable 130, without change of the mounting position of the GND element 146 in the cable holder 140.

In the second exemplary embodiment, the fixing position of the boot switch 145 in the cable holder 140 is not changed, as well as the fixing position of the GND element 146 may not be changed, in a case where the routing direction for the cable 130 is changed. Hence, in the second exemplary embodiment, the cable holder 140 can increase in seize in comparison with the case of the above-mentioned first exemplary embodiment. In contrast, the second exemplary embodiment enables for reduction of an operation involved in change of the mounting position of the boot switch 145 (the change can include change of the mounting position of the GND element 146) in comparison with the case of the above-mentioned first exemplary embodiment. Thus, use of the cable holder 140 according to either the first exemplary embodiment or the second exemplary embodiment differently depending on circumstances, enables adopting the cable holder 140 that is effective for solving issues solved by the present disclosure.

As in the above-described first exemplary embodiment, the second exemplary embodiment also enables providing of the radiation imaging apparatus 100 enabling for change of the routing direction for the cable 130 with a simple configuration and a simple operation. This can prevent the cable 130 from becoming an obstacle and prevents load due to excessive bending of the cable 130, for example, when the housing 110 of the radiation imaging apparatus 100 is fixed to the imaging table.

The disclosure of the exemplary embodiments includes the following configurations:

[Configuration 1]

A radiation imaging apparatus including a radiation detector configured to detect incident radiation and convert the detected incident radiation into an electric signal regarding a radiation image. A housing containing the radiation detector, a cable configured to electrically connect the radiation detector and an external apparatus, and a cable holder fixed to the housing configured to hold the cable, wherein the cable holder includes a plurality of openings for routing the cable in different directions.

[Configuration 2]

The radiation imaging apparatus according to Configuration 1, wherein the cable holder includes a protruded portion and a cable retaining plate that are configured to prevent withdrawal of the cable routed through one opening of the plurality of openings, a switch configured to switch an imaging mode of the radiation imaging apparatus; and a ground element configured to ensure conduction with inside of the radiation imaging apparatus.

[Configuration 3]

The radiation imaging apparatus according to Configuration 2, wherein, in a case where a routing direction for the cable is switched using the cable holder, a mounting position of the cable retaining plate in the cable holder is changed.

[Configuration 4]

The radiation imaging apparatus according to Configuration 2 or 3, wherein, in a case where a routing direction for the cable is switched using the cable holder, a mounting position of the switch in the cable holder is changed.

[Configuration 5]
The radiation imaging apparatus according to any one of Configurations 2 to 4, wherein, in a case where a routing direction for the cable is switched using the cable holder, a mounting position of the ground element in the cable holder is changed.

[Configuration 6]
The radiation imaging apparatus according to any one of Configurations 1 to 5, wherein the cable holder further includes a cable holder cover that covers inside of the cable holder, and wherein a routing direction for the cable is switched via an operation performed inside the cable holder with the cable holder cover removed.

[Configuration 7]
The radiation imaging apparatus according to Configuration 6, wherein the cable holder cover is arranged on a radiation incident surface on which the radiation is incident in the housing.

[Configuration 8]
The radiation imaging apparatus according to Configuration 6 or 7, wherein the cable holder cover is removable from the cable holder with the housing not being assembled.

[Configuration 9]
The radiation imaging apparatus according to any one of Configurations 6 to 8, wherein the cable holder cover includes a cover opening arranged in a location of one opening from which the cable is withdrawn from among the plurality of openings in the cable holder, and a cover protrusion arranged in a location of another opening different from the one opening from which the cable is withdrawn from among the plurality of openings in the cable holder.

[Configuration 10]
The radiation imaging apparatus according to Configuration 9, wherein the cover opening is arranged at a position where the cover opening, together with the one opening, presses the cable.

[Configuration 11]
The radiation imaging apparatus according to Configuration 9 or 10, wherein the cover protrusion is arranged to cover the different opening.

[Configuration 12]
The radiation imaging apparatus according to any one of Configurations 6 to 11, wherein the cable holder cover is mountable in different positions with respect to the cable holder.

[Configuration 13]
The radiation imaging apparatus according to any one of Configurations 1 to 12, wherein a fixing portion for mounting the housing to an imaging table is arranged on a back surface of the housing on an opposite side of a radiation incident surface of the housing, the radiation incident surface being a surface on which the radiation is incident.

[Configuration 14]
A cable holder fixed to a housing containing a radiation detector and configured to hold a cable configured to electrically connect the radiation detector and an external apparatus, the cable holder comprising a plurality of openings for routing the cable in different directions.

OTHER EMBODIMENTS

Embodiment(s) can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While exemplary embodiments have been described, these embodiments are not seen to be limiting. The scope of the following claims is to be accorded the broadest interpretation to encompass all such modifications and equivalent structures and functions.

This application claims the benefit of Japanese Patent Application No. 2022-079520, filed May 13, 2022, which is hereby incorporated by reference herein in its entirety.

What is claimed is:

1. A radiation imaging apparatus comprising:
   a radiation detector configured to detect incident radiation and convert the detected incident radiation into an electric signal regarding a radiation image;
   a housing containing the radiation detector;
   a cable configured to electrically connect the radiation detector and an external apparatus; and
   a cable holder fixed to the housing and configured to hold the cable,
   wherein the cable holder includes a plurality of openings for routing the cable in different directions,
   wherein the cable holder includes a cable fixing member having a cable fixing portion for fixing the cable, and a cover member for covering the cable fixing portion, and
   wherein the cover member is a member arranged on an incident side of the incident radiation among members constituting the cable holder.

2. The radiation imaging apparatus according to claim 1, wherein the cable holder includes:
   a protruded portion and a cable retaining plate that are configured to prevent withdrawal of the cable routed through one opening of the plurality of openings;
   a switch configured to switch an imaging mode of the radiation imaging apparatus; and
   a ground element configured to ensure conduction with inside of the radiation imaging apparatus.

3. The radiation imaging apparatus according to claim 2, wherein, in a case where a routing direction for the cable is switched using the cable holder, a mounting position of the cable retaining plate in the cable holder is changed.

4. The radiation imaging apparatus according to claim 2, wherein, in a case where a routing direction for the cable is switched using the cable holder, a mounting position of the switch in the cable holder is changed.

5. The radiation imaging apparatus according to claim 1, wherein, in a case where a routing direction for the cable is switched using the cable holder, a mounting position of the ground element in the cable holder is changed.

6. The radiation imaging apparatus according to claim 1, wherein the cable holder further includes a cable holder cover that covers inside of the cable holder, and
wherein a routing direction for the cable is switched via an operation performed inside the cable holder with the cable holder cover removed.

7. The radiation imaging apparatus according to claim 6, wherein the cable holder cover is removable from the cable holder with the housing not being disassembled.

8. The radiation imaging apparatus according to claim 6, wherein the cable holder cover includes:
a cover opening arranged in a location of one opening from which the cable is withdrawn from among the plurality of openings in the cable holder; and
a cover protrusion arranged in a location of a different opening from which the cable is withdrawn from among the plurality of openings in the cable holder.

9. The radiation imaging apparatus according to claim 8, wherein the cover opening is arranged at a position where the cover opening, together with the one opening, presses the cable.

10. The radiation imaging apparatus according to claim 8, wherein the cover protrusion is arranged to cover the different opening.

11. The radiation imaging apparatus according to claim 6, wherein the cable holder cover is mountable in different positions with respect to the cable holder.

12. The radiation imaging apparatus according to claim 1, wherein a fixing portion for mounting the housing to an imaging table is arranged on a back surface of the housing on an opposite side of a radiation incident surface of the housing, the radiation incident surface being a surface on which the radiation is incident.

13. A cable holder fixed to a housing containing a radiation detector and configured to hold a cable configured to electrically connect the radiation detector and an external apparatus, the cable holder comprising a plurality of openings for routing the cable in different directions,
wherein the cable holder includes a cable fixing member having a cable fixing portion for fixing the cable, and a cover member for covering the cable fixing portion, and
wherein the cover member is a member arranged on an incident side of the incident radiation among members constituting the cable holder.

* * * * *